(12) United States Patent
Lim

(10) Patent No.: US 7,313,212 B2
(45) Date of Patent: Dec. 25, 2007

(54) SHIFT REGISTER HAVING LOW POWER CONSUMPTION AND METHOD OF OPERATION THEREOF

(75) Inventor: Jeong-Joo Lim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 169 days.

(21) Appl. No.: 11/339,647

(22) Filed: Jan. 25, 2006

(65) Prior Publication Data
US 2006/0171501 A1    Aug. 3, 2006

(30) Foreign Application Priority Data
Jan. 28, 2005    (KR)    ............. 10-2005-0007985

(51) Int. Cl.
*G11C 19/00*    (2006.01)
(52) U.S. Cl. ............. 377/64; 377/70; 377/73; 377/77
(58) Field of Classification Search ............. None
See application file for complete search history.

(56) References Cited

U.S. PATENT DOCUMENTS

RE35,254 E * 5/1996 Chaisemartin et al. ........ 377/47
6,556,647 B1 * 4/2003 Neravetla ............. 377/70
6,654,439 B1 * 11/2003 Kommrusch ............. 377/54
7,181,662 B2 * 2/2007 Chien ............. 714/724

FOREIGN PATENT DOCUMENTS

| JP | 2001-135093 | 5/2001 |
| JP | 2004-185787 | 7/2004 |
| KR | 10-2004-0061958 | 7/2004 |

* cited by examiner

*Primary Examiner*—Tuan T Lam
(74) *Attorney, Agent, or Firm*—F. Chau & Assoc., LLC

(57) ABSTRACT

The shift register, which is an n-th shift register of a shift register chain, includes a first multiplexer, a second multiplexer, and a latch block, wherein n is a positive integer. The first multiplexer selects one of output data of the (n−1)-th shift register or output data of the (n+1)-th shift register and outputs the selected data to be used as a reset signal in the latch block. The second multiplexer selects one of the output data of the (n−1)-th shift register or the output data of the (n+1)-th shift register and outputs the selected data to be used as input data of the latch block. The latch block stores the output data of the second multiplexer in response to the clock control signal, the inverted clock control signal and the reset voltage, and outputs the stored data.

15 Claims, 5 Drawing Sheets

SHIFT REGISTER HAVING LOW POWER CONSUMPTION AND METHOD OF OPERATION THEREOF

CROSS-REFERENCE TO RELATED PATENT APPLICATIONS

This application claims priority to Korean Patent Application No. 10-2005-0007985, filed on Jan. 28, 2005, the disclosure of which is herein incorporated by reference in its entirety.

BACKGROUND OF THE INVENTION

1. Technical Field

The present invention relates to a shift register and, more particularly, to a shift register having low power consumption.

2. Description of the Related Art

Shift registers store a bit of data in each register and output the stored data in response to a clock signal. Shift register chains may be any length, with as many output stages or input stages as required.

FIG. 1 is a block diagram of a shift register chain 100 with 3 stages. Referring to FIG. 1, the shift register chain 100 is made up of an (n−1)-th shift register 110, an n-th shift register 111, and an (n+1)-th shift register 112, where n denotes a positive integer. The ports q, p, s, CK_T, and RST shown in FIG. 1 on the upper part of the n-th shift register 111 are connected to ports r, q, s, CK_B, and RST, respectively, on the lower part of the (n−1)-th shift register 110. Ports r, q, s, CK_B, and RST shown on the lower part of the n-th shift register 111 are connected to ports q, p, s, CK_T, and RST, respectively, on the upper part of the (n+1)-th shift register 112. The shift registers 110, 111 and 112 may be controlled so that data can be shifted in a selected direction in the shift register chain FIG. 2 is a block diagram of a conventional shift register 200. Referring to FIG. 2, the shift register 200 includes a multiplexer (MUX) 210, a latch circuit 220, and an inverter 230. The inverter 230 buffers data received from the latch circuit 220 and transmits the buffered data to an output port O.

The MUX 210 has two signal inputs p and r, one control input s, and one output. The latch circuit 220 stores an output signal of the MUX 210 received via an input port D in response to a clock signal, received via a clock port CKN, and outputs stored data via a first output port Q. When the latch circuit 220 receives a reset signal RST via a reset port RN, the output of the latch circuit 220 is reset.

Although not shown as such in FIG. 2, the output port Q of the latch circuit 220 is connected to the q nodes shown on the upper and lower parts of the diagram of the shift register 200 and the q nodes are connected to each other.

FIG. 3 is a circuit diagram of the latch circuit 220 of FIG. 2. Referring to FIG. 3, the latch circuit 220 includes a signal generation block 221 and a data latch block 222.

The signal generation block 221 generates a clock control signal CL, which is in phase with the clock signal received via the clock port CKN, an inverted clock control signal CLB, which is 180° out of phase with the clock signal, and an inverted reset signal RNB, which is obtained by changing by 180° the phase of the reset signal RST received from an external source via the reset port RN.

The data latch block 222 includes a master stage 222-M and a slave stage 222-S. The master stage 222-M and the slave stage 222-S latch a data signal received via the input port D in response to the signals CL, CLB, RN, and RNB, which are generated by the signal generation block 221.

The data latch block 222 may be well known to one of ordinary skill in the art and, thus, a detailed description thereof has been omitted.

The latch circuit 220 of FIG. 2 generates the clock control signal CL and the inverted clock control signal CLB in the case when data having either a logic high or logic low value is received via the input port D. Although the layout of latch circuit 220 shows two CMOS inverters connected in series, current is consumed while the outputs of the inverters are changing from one logic state to another. This current consumption may cause significant power consumption depending on the number of shift registers and the frequency of a clock signal.

SUMMARY OF THE INVENTION

Exemplary embodiments of the present invention provide a shift register having low power consumption and a method of operation thereof.

According to an exemplary embodiment of the present invention, an n-th shift register includes a first multiplexer, a second multiplexer, and a latch block. The first multiplexer selects and outputs one of output data of an (n−1)-th shift register or output data of an (n+1)-th shift register in response to a direction control signal. The second multiplexer selects and outputs one of the output data of the (n−1)-th shift register or the output data of the (n+1)-th shift register in response to the direction control signal. The latch block stores output data of the second multiplexer in response to a clock signal, a reset signal, and output data of the first multiplexer, and outputs the stored data. According to another aspect of the present invention, there is provided a method of operating an n-th shift register of a shift register chain, the method comprising the steps of: determining whether output data of an (n−1)-th shift register enables or disables the n-th shift register; if it is determined that the output data of the (n−1)-th shift register disables the n-th shift register, transforming a value of a clock signal into a DC voltage value and providing the clock signal with the DC voltage value to the n-th shift register; if it is determined that the output data of the (n−1)-th shift register enables the n-th shift register, supplying the normal clock signal to the n-th shift register; transmitting the output data of the (n−1)-th shift register to an (n+1)-th shift register via the n-th shift register in response to the normal clock signal; and transmitting output data of the n-th shift register to an (n+2)-th shift register and resetting the n-th shift register in response to the output data of the (n+1)-th shift register, wherein n is a positive integer.

BRIEF DESCRIPTION OF THE DRAWINGS

The present invention will become more apparent to those of ordinary skill in the art when descriptions of exemplary embodiments thereof are read with reference to the accompanying drawings, of which.

DETAILED DESCRIPTION OF THE EXEMPLARY EMBODIMENTS

Figure 1:
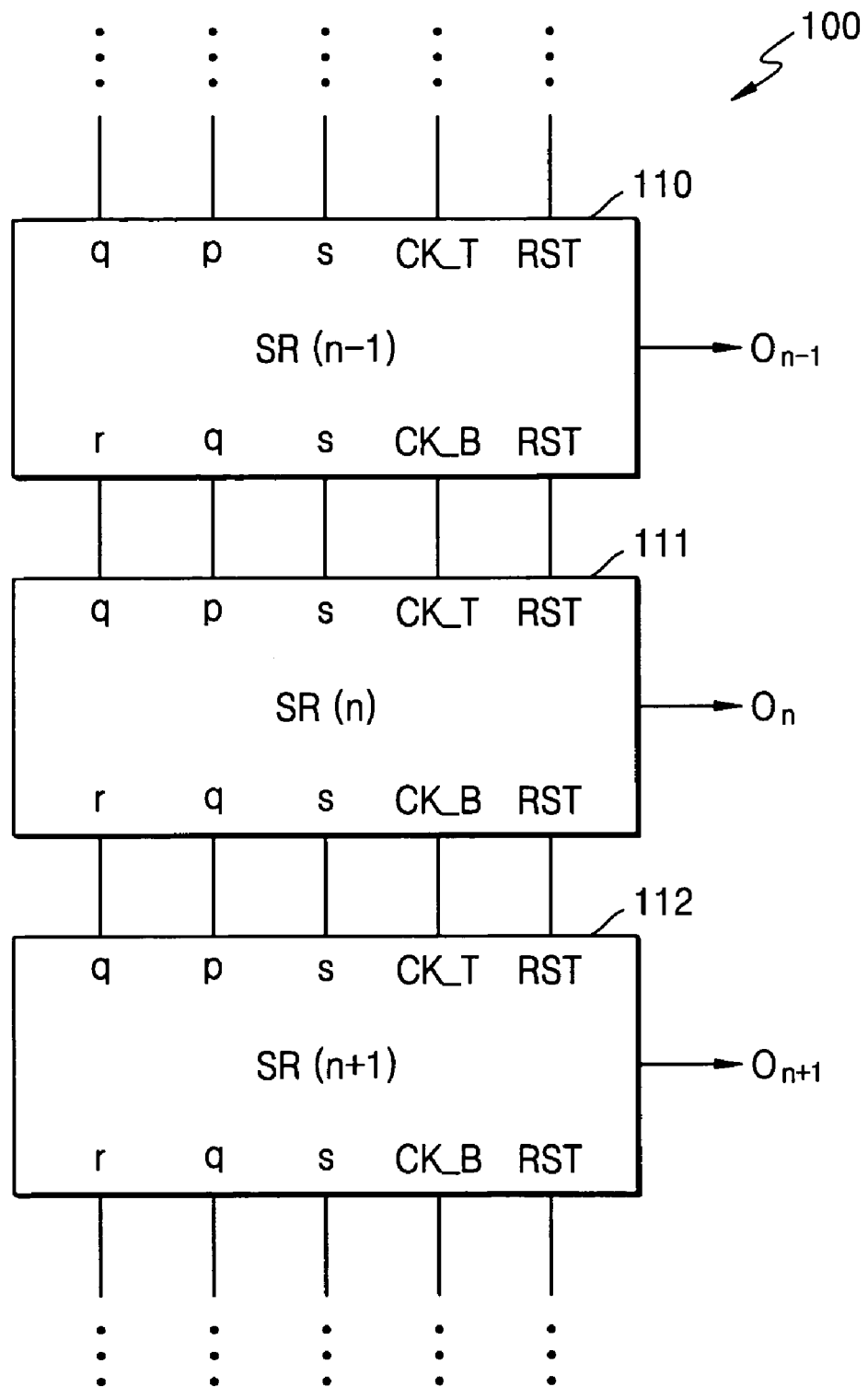
FIG. 1 is a block diagram of a shift register chain.

Hereinafter, the exemplary embodiments of the present invention will be described in detail with reference to the accompanying drawings. Like reference numerals refer to similar or identical elements throughout the description of the figures.

Spatially relative terms, such as "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

Figure 4:
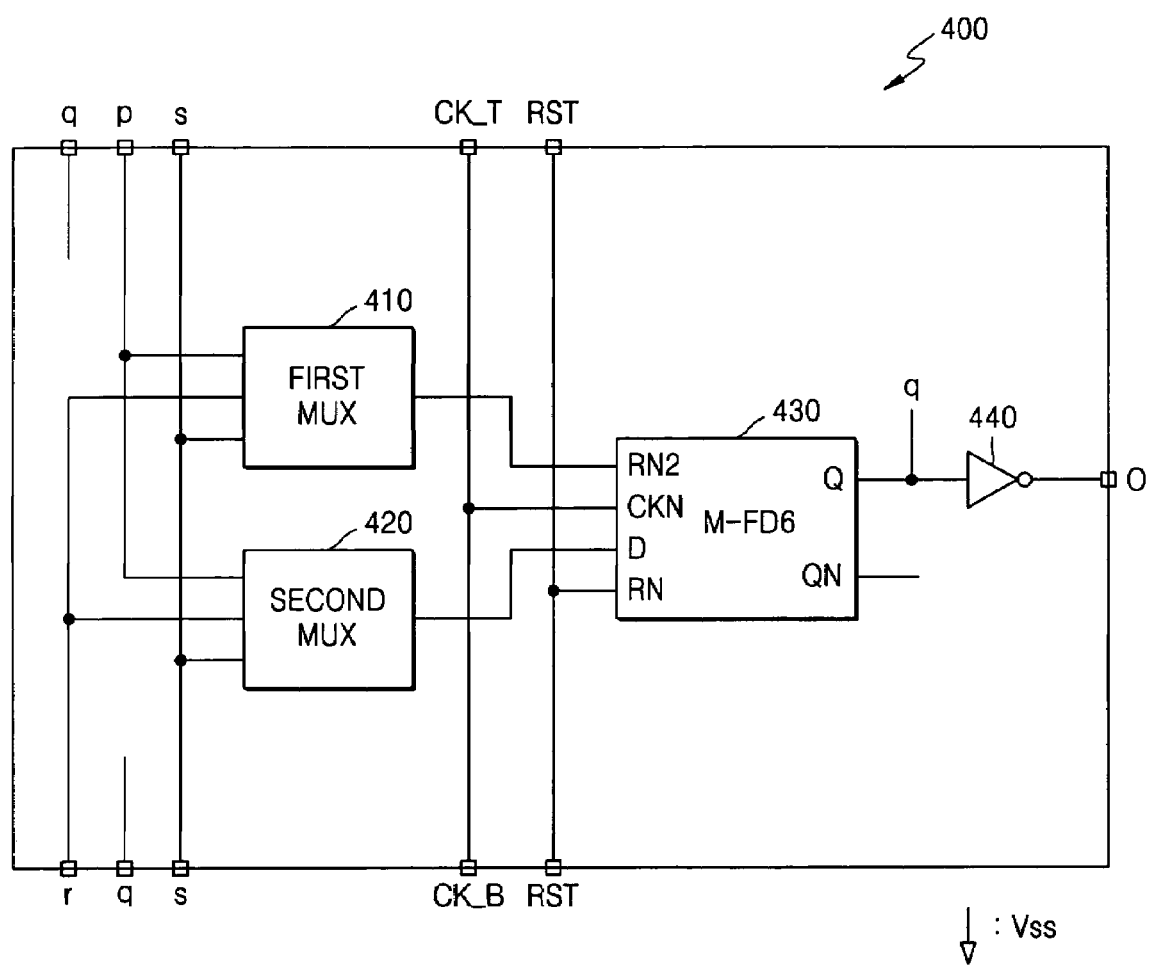
FIG. 4 is a block diagram of a shift register according to an exemplary embodiment of the present invention.

FIG. 4 is a block diagram of a shift register 400, according to an exemplary embodiment of the present invention. Referring to FIG. 4, the shift register 400 includes a first multiplexer (MUX) 410, a second MUX 420, a latch block 430, and an inverter 440.

The first MUX 410 selects and outputs either a signal received via an upper port p or a signal received via a lower port r in response to a direction control signal s. The signal output by the first MUX 410 is used as a reset signal in the latch block 430. The direction control signal s is used to indicate the direction of data transmission in the shift register chain. For example, the direction control signal s may indicate data transmission in a first direction or a second direction in the chain. In the case when the direction control signal s indicates data transmission in the first direction in the chain, in accordance with an exemplary embodiment of the present invention, the signal received via the lower port r is selected. In this case, the data transmitted to a shift register located one position behind the shift register 400 in the chain is fed back to the shift register 400 via the lower port r. In an embodiment of the present invention, if the data fed back to the shift register 400 is logic high, the shift register 400 is reset, and if the data is logic low, the shift register 400 keeps its present state. Alternatively, if the data is logic low, the shift register 400 is reset, and if the data is logic high, the shift register 400 keeps its present state.

The second MUX 420 selects and outputs either a signal received via the upper port p or a signal received via the lower port r in response to the direction control signal s. The signal output by the second MUX 420 is used as a data signal in the latch block 430. In the case when the direction control signal s indicates data transmission in a second direction in the chain, the signal received via the upper port p is selected and output. In this case, the output data q of a shift register located one position ahead of the shift register 400 in the chain is received by the shift register 400 via the upper port p.

The latch block 430 receives a reset signal RST via a first reset port RN, output data of the first MUX 410 via a second reset port RN2, output data of the second MUX 420 via an input port D, and the clock signals CK_T and CK_B via a clock port CKN. The operation of the latch block 430, according to an exemplary embodiment of the present invention, will be described below with reference to FIG. 5.

The inverter 440 buffers an output signal of the latch block 430 and outputs the buffered signal.

Figure 5:
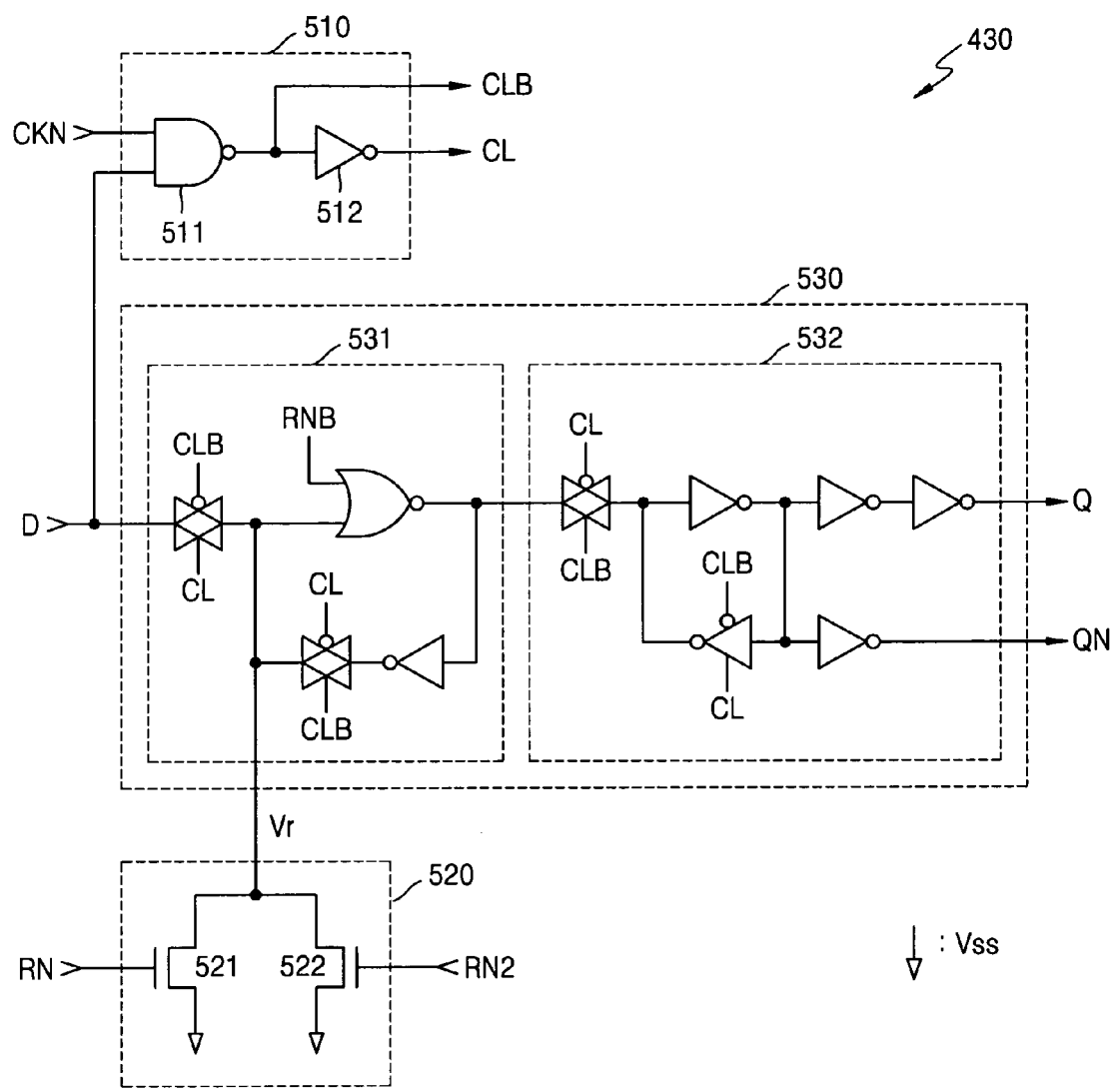
FIG. 5 is a circuit diagram of a latch block of the shift register shown in FIG. 4.

FIG. 5 is a circuit diagram of the latch block 430 shown in FIG. 4. Referring to FIG. 5, the latch block 430 includes an operation determining block 510, a reset block 520, and a latch circuit 530.

The operation determining block 510 determines whether to enable or disable the shift register 400 according to the output data of the second MUX 420, and outputs a clock control signal CL and an inverted clock control signal CLB depending upon a result of the determination.

When the shift register 400 is disabled in response to the output data of the second MUX 420, the clock control signal CL and the inverted clock control signal CLB have predetermined DC voltage values. On the other hand, when the shift register 400 is enabled in response to the output data of the second MUX 420, the clock control signal CL is a signal in phase with a clock signal received via the clock port CKN, and the inverted clock control signal CLB is a signal 180° out of phase with the clock signal.

The operation determining block 510 includes a first operation determining block 511, which outputs the inverted clock control signal CLB in response to the clock signal and the output data of the second MUX 420, and a second operation determining block 512, which inverts a phase of the inverted clock control signal CLB to output the clock control signal CL.

The first operation determining block 511, according to an exemplary embodiment of the present invention, is a NAND gate that can output the inverted clock control signal CLB in response to the clock signal and the output data of the second MUX 420. The second operation determining block 512, according to an exemplary embodiment of the present invention, is an inverter that can output the clock control signal CL by inverting the phase of the inverted clock control signal CLB.

The reset block 520 outputs a reset voltage Vr in response to the reset signal RST and/or output data RN2 of the first MUX 410. The reset block 520 includes a first reset circuit 521 and a second reset circuit 522.

The first reset circuit 521 outputs the reset voltage Vr in response to the reset signal RST. According to an exemplary embodiment of the present invention, the first reset circuit 521 is a first MOS transistor having a first terminal connected to a low power supply voltage Vss, a gate through which the reset signal RST is received, and a second terminal through which the reset voltage Vr is output.

The second reset circuit 522 outputs the reset voltage Vr in response to the output data of the first MUX 410. According to an exemplary embodiment of the present invention, the second reset circuit 522 is a second MOS transistor having a first terminal connected to the low power supply voltage Vss, a gate through which the output data of the first MUX 410 is received, and a second terminal through which the reset voltage Vr is output.

The latch circuit 530 includes a master stage 531 and a slave stage 532. The master stage 531 stores the output data of the second MUX 420 in response to the clock control signal CL and the inverted clock control signal CLB and stores predetermined data in response to the reset voltage Vr. The slave stage 532, which receives the data stored in the master stage 531 in response to the clock control signal CL and the inverted clock control signal CLB, stores and outputs the received data.

Hereinafter, a method of operating an n-th (where n denotes a positive integer) shift register of a shift register chain will be described. In a first step, it is determined whether output data of an (n−1)-th shift register enables or disables the n-th shift register.

If it is determined that the output data of the (n−1)-th shift register disables the n-th shift register, a value of a clock signal is transformed into a DC voltage value, and the clock signal with the DC voltage value is supplied to the n-th shift register. On the other hand, if it is determined that the output data of the (n−1)-th shift register enables the n-th shift register, the normal clock signal is supplied to the n-th shift register.

In response to the normal clock signal, the output data of the (n−1)-th shift register is transmitted to an (n+1)-th shift register via the n-th shift register. The output data of the n-th shift register is transmitted to an (n+2)-th shift register and the n-th shift register is reset in response to the output data of the (n+1)-th shift register. For example, the output data of the n-th shift register may be transmitted to an (n+2)-th shift register and the n-th shift register may be reset substantially simultaneously in response to the output data of the (n+1)-th shift register.

In an embodiment of the present invention, if the output data of the (n−1)-th shift register is logic high, the n-th shift register is enabled, and if the output data of the (n−1)-th shift register is logic low, the n-th shift register is disabled. Alternatively, if the output data of the (n−1)-th shift register is logic low, the n-th shift register is enabled, and if the output data of the (n−1)-th shift register is logic high, the n-th shift register is disabled.

Generally, all shift registers of the shift register chain are set to have predetermined logic values before starting to operate. For example, the shift registers may be set to logic low values.

According to an exemplary embodiment of the present invention, when data is to be transmitted from a current shift register to an adjacent shift register in the chain, a determination is made whether to enable the current shift register.

In the case when it is determined that the current shift register does not need to operate, a clock signal used to operate a shift register is not supplied to the current shift register. Alternatively, a value of the clock signal is transformed into a DC voltage value, and the clock signal with the DC voltage value is supplied to the current shift register. As a result, the current shift register does not operate. On the other hand, in the case when it is determined that the current shift register needs to operate, the clock signal is supplied to the current shift register.

The determination of whether the current shift register needs to operate may be made according to several bases. In accordance with an exemplary embodiment of the present invention, because all of the shift registers of the shift register chain have been reset to logic low values, the transmission of data with a logic low value between adjacent shift registers in the chain is not needed. It is to be understood that if all of the shift registers of the chain have been reset to logic high values, the transmission of data with a logic high value between adjacent shift registers in the chain is not needed.

In an exemplary embodiment of the present invention, wherein all of the shift registers of the chain have been reset to logic low values, only when the data to be transmitted is logic high does the current shift register operate. When the data to be transmitted is logic low, the current shift register does not need to operate, and power consumption can be reduced. Alternatively, if all of the shift registers of the chain have been reset to logic high values, only when the data to be transmitted is logic low does the current shift register operate.

Figure 2:
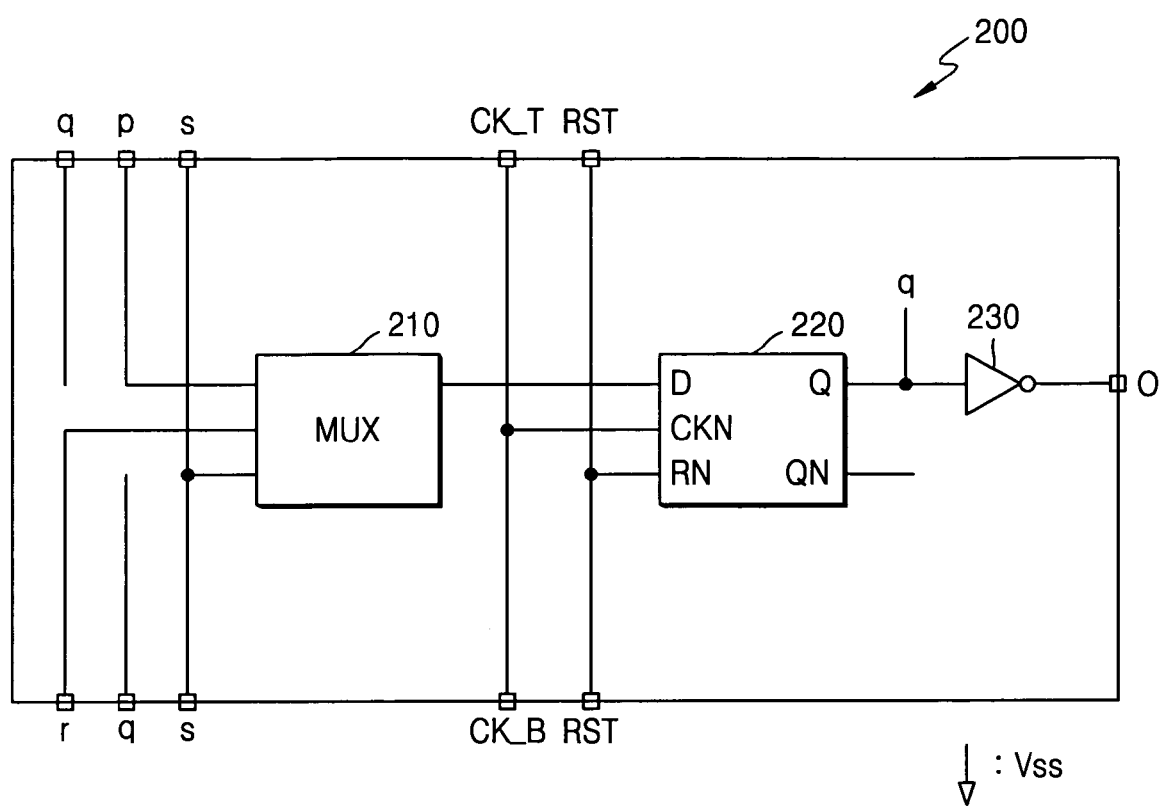
FIG. 2 is a block diagram of a conventional shift register.
Figure 3:
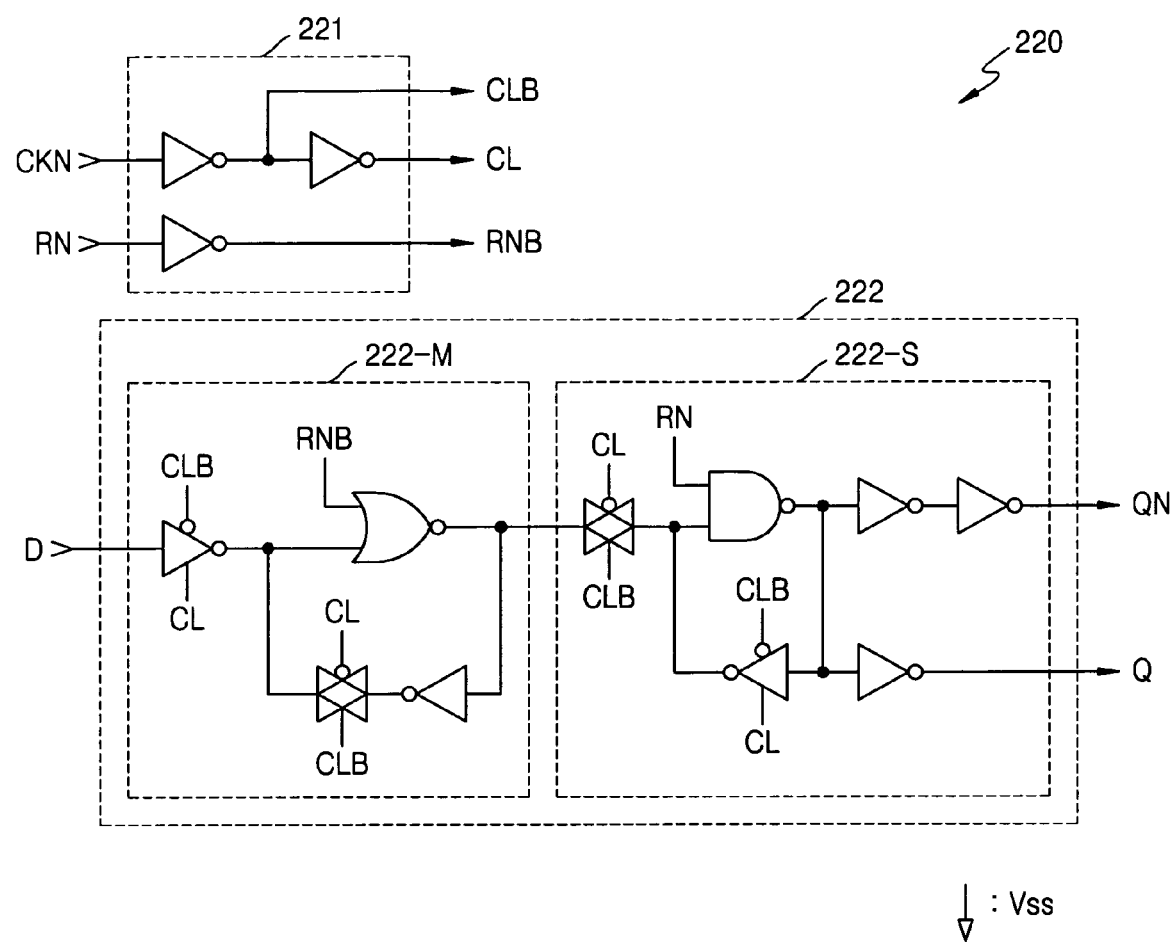
FIG. 3 is a circuit diagram of a latch circuit shown in FIG. 2.

In a computer model, when the conventional shift register of FIG. 2 was used, a total of 1.53 mA (milliampere) current was consumed. However, when the shift register of FIG. 4, according to an exemplary embodiment of the present invention, was used, only 0.43 mA current was consumed. Hence, the shift register of FIG. 4 saved current of about 1 mA. In this experiment, a transistor operating at 25° C. and at 2.5 V was used, and a clock signal of 15 MHz (Mega Hertz) was used.

Although the exemplary embodiments of the present invention have been described in detail with reference to the accompanying drawings for the purpose of illustration, it is to be understood that the inventive processes and apparatus are not to be construed as limited thereby. It will be readily apparent to those of reasonable skill in the art that various modifications to the foregoing exemplary embodiments may be made without departing from the scope of the invention as defined by the appended claims, with equivalents of the claims to be included therein.

What is claimed is:

1. A shift register which is an n-th shift register of a shift register chain, the n-th shift register comprising:
   a first multiplexer, wherein the first multiplexer selects and outputs one of output data of an (n−1)-th shift register or output data of an (n+1)-th shift register in response to a direction control signal;
   a second multiplexer, wherein the second multiplexer selects and outputs one of the output data of the (n−1)-th shift register or the output data of the (n+1)-th shift register in response to the direction control signal; and
   a latch block, wherein the latch block stores output data of the second multiplexer in response to a clock signal, a reset signal and output data of the first multiplexer, and outputs the stored data, and wherein n is a positive integer.

2. The shift register of claim 1, wherein the latch block is reset by at least one of the reset signal or the output data of the first multiplexer, wherein the reset signal resets all of the shift registers of the shift register chain ;and wherein the output data of the first multiplexer resets only the n-th shift register.

3. The shift register of claim 2, wherein the latch block comprises:
   an operation determining block determining whether to enable or disable the shift register according to the output data of the second multiplexer and outputting a clock control signal and an inverted clock control signal depending upon a result of the determination;
   a reset block outputting a reset voltage in response to at least one of the reset signal and the output data of the first multiplexer; and
   a latch circuit storing the output data of the second multiplexer in response to the clock control signal, the inverted clock control signal and the reset voltage, and outputting the stored data.

4. The shift register of claim 3, wherein
   when the shift register is disabled in response to the output data of the second multiplexer, the clock control signal and the inverted clock control signal output by the operation determining block have predetermined DC voltages, and wherein
   when the shift register is enabled in response to the output data of the second multiplexer, the clock control signal output by the operation determining block is in phase with the clock signal, and the inverted clock control signal output by the operation determining block is 180° out of phase with the clock signal.

5. The shift register of claim 4, wherein the operation determining block comprises:
   a first operation determining block outputting the inverted clock control signal in response to the clock signal and the output data of the second multiplexer; and a second operation determining block outputting the clock control signal by inverting a phase of the inverted clock control signal.

6. The shift register of claim 5, wherein the first operation determining block is a NAND gate that outputs the inverted clock control signal in response to the clock signal and the output data of the second multiplexer.

7. The shift register of claim 5, wherein the second operation determining block is an inverter that outputs the clock control signal by inverting the phase of the inverted clock control signal.

8. The shift register of claim 3, wherein the reset block comprises:
    a first reset circuit outputting the reset voltage in response to the reset signal; and
    a second reset circuit outputting the reset voltage in response to the output data of the first multiplexer.

9. The shift register of claim 8, wherein the first reset circuit is a first MOS transistor having a first terminal connected to a low power supply voltage, a gate through which the reset signal is received, and a second terminal through which the reset voltage is output.

10. The shift register of claim 8, wherein the second reset circuit is a second MOS transistor having a first terminal connected to the low power supply voltage, a gate through which the output data of the first multiplexer is received, and a second terminal through which the reset voltage is output.

11. The shift register of claim 3, wherein the latch circuit comprises:
    a master stage storing the output data of the second multiplexer in response to the clock control signal and the inverted clock control signal and storing predetermined data in response to the reset voltage; and
    a slave stage receiving, storing, and outputting the data stored in the master stage in response to the clock control signal and the inverted clock control signal.

12. The shift register of claim 3, wherein the latch circuit comprises:
    a master stage storing the output data of the second multiplexer in response to the clock control signal and the inverted clock control signal; and
    a slave stage receiving, storing, and outputting the data stored in the master stage in response to the clock control signal and the inverted clock control signal or storing and outputting predetermined data in response to the reset voltage.

13. The shift register of claim 1, further comprising an inverter buffering and outputting the output data of the latch block.

14. A method of operating an n-th shift register of a shift register chain, the method comprising:
    determining whether output data of an $(n-1)$-th shift register enables or disables the n-th shift register;
    if it is determined that the output data of the $(n-1)$-th shift register disables the n-th shift register, transforming a value of a clock signal into a DC voltage value and providing the clock signal with the DC voltage value to the n-th shift register;
    if it is determined that the output data of the $(n-1)$-th shift register enables the n-th shift register, supplying the normal clock signal to the n-th shift register;
    transmitting the output data of the $(n-1)$-th shift register to an $(n+1)$-th shift register via the n-th shift register in response to the normal clock signal; and
    transmitting the output data of the $(n+)$-th shift register to an $(n+2)$-th shift register and resetting the n-th shift register in response to the output data of the $(n+1)$-th shift register, wherein n is a positive integer.

15. The method of claim 14, wherein if the output data of the $(n-1)$-th shift register is logic high, the n-th shift register is enabled, and wherein if the output data of the $(n-1)$-th shift register is logic low, the n-th shift register is disabled.

* * * * *